United States Patent
Bulick et al.

(10) Patent No.: US 9,633,831 B2
(45) Date of Patent: Apr. 25, 2017

(54) CHEMICAL MECHANICAL POLISHING COMPOSITION FOR POLISHING A SAPPHIRE SURFACE AND METHODS OF USING SAME

(71) Applicants: Rohm and Haas Electronic Materials CMP Holdings, Inc., Newark, DE (US); Nitta Haas Incorporated, Osaka (JP)

(72) Inventors: Allen S. Bulick, East Norriton, PA (US); Hideaki Nishizawa, Kyoto (JP); Kazuki Moriyama, Kyoto (JP); Koichi Yoshida, Kyoto (JP); Shunji Ezawa, Kyoto (JP); Selvanathan Arumugam, Blue Bell, PA (US)

(73) Assignees: Rohm and Haas Electronic Materials CMP Holdings, Inc., Newark, DE (US); Nitta Haas Incorporated (JP)

( * ) Notice: Subject to any disclaimer, the term of this patent is extended or adjusted under 35 U.S.C. 154(b) by 157 days.

(21) Appl. No.: 13/975,890

(22) Filed: Aug. 26, 2013

(65) Prior Publication Data
US 2015/0053642 A1 Feb. 26, 2015

(51) Int. Cl.
C09G 1/02 (2006.01)
H01L 21/02 (2006.01)
C09K 3/14 (2006.01)

(52) U.S. Cl.
CPC .......... *H01L 21/02019* (2013.01); *C09G 1/02* (2013.01); *C09K 3/1409* (2013.01); *C09K 3/1463* (2013.01); *H01L 21/02013* (2013.01); *H01L 21/02035* (2013.01); *H01L 21/0242* (2013.01)

(58) Field of Classification Search
USPC .............................. 216/88, 89; 438/692, 693
See application file for complete search history.

(56) References Cited

U.S. PATENT DOCUMENTS

| | | | | |
|---|---|---|---|---|
| 4,356,107 A * | 10/1982 | Payne | | 516/81 |
| 5,385,604 A * | 1/1995 | Ainslie | | C09G 1/10 |
| | | | | 106/10 |
| 5,575,706 A * | 11/1996 | Tsai | | B24B 57/02 |
| | | | | 156/345.12 |
| 6,143,662 A * | 11/2000 | Rhoades et al. | | 438/690 |
| 6,190,234 B1 * | 2/2001 | Swedek et al. | | 451/6 |
| 6,638,328 B1 | 10/2003 | Lee et al. | | |
| 6,719,819 B2 * | 4/2004 | Ota et al. | | 51/308 |
| 7,169,031 B1 * | 1/2007 | Fletcher | | B24B 37/245 |
| | | | | 451/528 |
| 7,294,044 B2 | 11/2007 | Ferranti et al. | | |
| 7,754,098 B2 | 7/2010 | Schroeder et al. | | |
| 8,247,328 B2 | 8/2012 | White et al. | | |
| 8,372,305 B2 | 2/2013 | Schubert et al. | | |
| 2003/0061766 A1 | 4/2003 | Vogt et al. | | |
| 2004/0266183 A1 * | 12/2004 | Miller | | C09G 1/02 |
| | | | | 438/687 |
| 2006/0196849 A1 | 9/2006 | Moeggenborg et al. | | |
| 2007/0117497 A1 * | 5/2007 | Moeggenborg | | B24B 37/0056 |
| | | | | 451/41 |
| 2008/0283502 A1 * | 11/2008 | Moeggenborg et al. | | 216/88 |
| 2009/0098807 A1 * | 4/2009 | Bakshi et al. | | 451/36 |
| 2009/0104851 A1 | 4/2009 | Cherian et al. | | |
| 2010/0159807 A1 * | 6/2010 | Bian et al. | | 451/36 |
| 2012/0264303 A1 | 10/2012 | Chen et al. | | |
| 2013/0000214 A1 * | 1/2013 | Chu | | C09G 1/02 |
| | | | | 51/308 |
| 2013/0161285 A1 * | 6/2013 | Li et al. | | 216/13 |
| 2013/0200038 A1 * | 8/2013 | Li et al. | | 216/13 |
| 2014/0263170 A1 * | 9/2014 | Long et al. | | 216/38 |
| 2014/0302753 A1 * | 10/2014 | Morinaga et al. | | 451/59 |
| 2015/0052822 A1 * | 2/2015 | Ji | | 51/298 |

FOREIGN PATENT DOCUMENTS

| | | |
|---|---|---|
| CN | 102585705 | 7/2012 |
| WO | 2008085187 | 7/2008 |
| WO | 2009042696 | 4/2009 |

* cited by examiner

*Primary Examiner* — Shamim Ahmed
(74) *Attorney, Agent, or Firm* — Thomas S. Deibert; John J. Piskorski

(57) ABSTRACT

A method of polishing a sapphire substrate is provided, comprising: providing a substrate having an exposed sapphire surface; providing a chemical mechanical polishing slurry, wherein the chemical mechanical polishing slurry comprises, as initial components: colloidal silica abrasive, wherein the colloidal silica abrasive has a negative surface charge; and, wherein the colloidal silica abrasive exhibits a multimodal particle size distribution with a first particle size maximum between 2 and 25 nm; and, a second particle size maximum between 75 and 200 nm; optionally, a biocide; optionally, a nonionic defoaming agent; and, optionally, a pH adjuster. A chemical mechanical polishing composition for polishing an exposed sapphire surface is also provided.

2 Claims, No Drawings

CHEMICAL MECHANICAL POLISHING COMPOSITION FOR POLISHING A SAPPHIRE SURFACE AND METHODS OF USING SAME

The present invention relates to a chemical mechanical polishing composition for polishing an exposed sapphire surface and a method of polishing a sapphire substrate. More particularly, the present invention relates to a method of polishing a sapphire substrate using a chemical mechanical polishing slurry, wherein the chemical mechanical polishing slurry comprises, as initial components: colloidal silica abrasive, wherein the colloidal silica abrasive has a negative surface charge; and, wherein the colloidal silica abrasive exhibits a multimodal particle size distribution with a first particle size maximum between 2 and 25 nm; and, a second particle size maximum between 75 and 200 nm; a biocide; optionally, a nonionic defoaming agent; and, optionally, a pH adjuster.

The single crystal form of aluminum oxide (Sapphire) possesses exceptional optical, mechanical and chemical properties. As a consequence, sapphire has found extensive use in various electronic and optical devices.

Sapphire exhibits a rhombohedral crystal structure and a high degree of anisotropy. The properties exhibited are dependent on the crystallographic orientation. Accordingly, sapphire wafers used in semiconductor processing are typically cut along a particular crystallographic axis depending on the end use application. For example, C-plane sapphire substrates are cut along the zero-degree plane. C-plane sapphire substrates have particular utility for processes involving the growth of and II-VI compounds (e.g., GaN for manufacture of blue LEDs and laser diodes).

Because subsequent processing (e.g., metallization) requires the sapphire wafers to have a flat surface, the sapphire wafers need to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

While the properties of sapphire provides numerous end use advantages, sapphire's hardness and resistance to chemical attack makes effective polishing and planarization difficult.

One polishing composition for polishing sapphire surfaces is disclosed in United States Patent Application Publication No. 20090104851 to Cherian et al. Cherian et al. disclose a chemical mechanical polishing composition for polishing sapphire comprising a mixture of a first type of abrasive particles and a second type of abrasive particles dispersed within an aqueous medium, wherein the first type of abrasive particles is harder than the surface being polished and the second type of abrasive particles have a hardness that is softer than the surface being polished.

Another polishing composition for polishing sapphire surfaces is disclosed in United States Patent Application Publication No. 20060196849 to Moeggenborg et al. Moeggenborg et al. disclose a composition and method for polishing sapphire surfaces, comprising: abrading a sapphire surface, such as a C-plane or R-plane surface of a sapphire wafer, with a polishing slurry comprising an abrasive amount of an inorganic abrasive material such as colloidal silica suspended in an aqueous medium having a salt compound dissolved therein, wherein the aqueous medium has a basic pH and includes the salt compound in an amount sufficient to enhance the sapphire removal rate relative to the rate achievable under the same polishing conditions using the same inorganic abrasive in the absence of the salt compound.

Notwithstanding, there remains a continued need for chemical mechanical polishing compositions and methods formulated to provide a desirable balance of polishing properties to suit changing design needs, including high sapphire removal rates (i.e., ≥14,000 Å/hr).

The present invention provides a method of polishing a sapphire substrate, comprising: providing a substrate having an exposed sapphire surface; providing a chemical mechanical polishing slurry having a pH of >8 to 12, wherein the chemical mechanical polishing slurry comprises, as initial components: colloidal silica abrasive, wherein the colloidal silica abrasive has a negative surface charge; and, wherein the colloidal silica abrasive exhibits a multimodal particle size distribution with a first particle size maximum between 2 and 25 nm; and, a second particle size maximum between 75 and 200 nm; optionally, a biocide; optionally, a nonionic defoaming agent; and, optionally, a pH adjuster; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥14,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven polishing pad.

The present invention provides a method of polishing a sapphire substrate, comprising: providing a substrate having an exposed sapphire surface; providing a chemical mechanical polishing slurry having a pH of >8 to 12, wherein the chemical mechanical polishing slurry comprises, as initial components: 10 to 40 wt % of a colloidal silica abrasive, wherein the colloidal silica abrasive has a negative surface charge; and, wherein the colloidal silica abrasive exhibits a multimodal particle size distribution with a first particle size maximum between 2 and 25 nm; and, a second particle size maximum between 75 and 200 nm; optionally, a biocide; optionally, a nonionic defoaming agent; and, optionally, a pH adjuster; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥14,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven polishing pad.

The present invention provides a method of polishing a sapphire substrate, comprising: providing a substrate having an exposed sapphire surface; providing a chemical mechanical polishing slurry having a pH of >8 to 12, wherein the chemical mechanical polishing slurry comprises, as initial components: colloidal silica abrasive, wherein the colloidal silica abrasive has a negative surface charge; and, wherein the colloidal silica abrasive exhibits a multimodal particle size distribution with a first particle size maximum between 2 and 25 nm; and, a second particle size maximum between 75 and 185 nm; optionally, a biocide; optionally, a nonionic defoaming agent; and, optionally, a pH adjuster; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥14,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven polishing pad.

The present invention provides a method of polishing a sapphire substrate, comprising: providing a substrate having an exposed sapphire surface; providing a chemical mechanical polishing slurry having a pH of >8 to 12, wherein the chemical mechanical polishing slurry comprises, as initial components: 10 to 30 wt % of a colloidal silica abrasive; wherein the colloidal silica abrasive is a mixture of a first population of colloidal silica particles having an average particle size of 10 to 25 nm and a second population of colloidal silica particles having an average particle size of 90 to 110 nm; wherein the colloidal silica abrasive contains 1 to 25 wt % of the first population of colloidal silica particles; a biocide; 0.2 to 1.5 wt % of a nonionic defoaming agent, wherein the nonionic defoaming agent is a silicon based defoamer; and, optionally, a pH adjuster; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥15,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven pad.

The present invention provides a method of polishing a sapphire substrate, comprising: providing a substrate having an exposed sapphire surface; providing a chemical mechanical polishing slurry having a pH of 9 to 10, wherein the chemical mechanical polishing slurry comprises, as initial components: 10 to 30 wt % of a colloidal silica abrasive; wherein the colloidal silica abrasive is a mixture of a first population of colloidal silica particles having an average particle size of 10 to 21 nm and a second population of colloidal silica particles having an average particle size of 95 to 105 nm; wherein the colloidal silica abrasive contains 1 to 25 wt % of the first population of colloidal silica particles; wherein the chemical mechanical polishing slurry contains 0.45 to 1.05 wt % of a nonionic defoaming agent, wherein the nonionic defoaming agent is a silicon based defoamer; a biocide; and, optionally, a pH adjuster; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥20,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven pad.

The present invention provides a method of polishing a sapphire substrate, comprising: providing a substrate having an exposed sapphire surface; providing a chemical mechanical polishing slurry having a pH of 9 to 10, wherein the chemical mechanical polishing slurry comprises, as initial components: 10 to 30 wt % of a colloidal silica abrasive; wherein the colloidal silica abrasive is a mixture of a first population of colloidal silica particles having an average particle size of 14 to 16 nm and a second population of colloidal silica particles having an average particle size of 95 to 105 nm; wherein the colloidal silica abrasive contains 1 to 25 wt % of the first population of colloidal silica particles; wherein the chemical mechanical polishing slurry contains 0.45 to 1.05 wt % of a nonionic defoaming agent, wherein the nonionic defoaming agent is a silicon based defoamer; a biocide; and, optionally, a pH adjuster; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥20,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven pad.

The present invention provides a method of polishing a sapphire substrate, comprising: providing a substrate having an exposed sapphire surface; providing a chemical mechanical polishing slurry having a pH of 9 to 10; wherein the chemical mechanical polishing slurry consists of a colloidal silica abrasive; a nonionic defoaming agent; the biocide; and, optionally, the pH adjuster; wherein the chemical mechanical polishing slurry contains 10 to 30 wt % of the colloidal silica abrasive; wherein the colloidal silica abrasive is a mixture of a first population of colloidal silica particles having an average particle size of 10 to 21 nm and a second population of colloidal silica particles having an average particle size of 95 to 105 nm; wherein the colloidal silica abrasive contains 1 to 25 wt % of the first population of colloidal silica particles; wherein the chemical mechanical polishing slurry contains 0.45 to 1.05 wt % of the nonionic defoaming agent, wherein the nonionic defoaming agent is a silicon based defoamer; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥20,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven pad.

The present invention provides a method of polishing a sapphire substrate, comprising: providing a substrate having an exposed sapphire surface; providing a chemical mechanical polishing slurry having a pH of 9 to 10; wherein the chemical mechanical polishing slurry consists of the colloidal silica abrasive; the nonionic defoaming agent; the biocide; and, optionally, the pH adjuster; wherein the chemical mechanical polishing slurry contains 10 to 30 wt % of the colloidal silica abrasive; wherein the colloidal silica abrasive is a mixture of a first population of colloidal silica particles having an average particle size of 14 to 16 nm and a second population of colloidal silica particles having an average particle size of 95 to 105 nm; wherein the colloidal silica abrasive contains 1 to 25 wt % of the first population of colloidal silica particles; wherein the chemical mechanical polishing slurry contains 0.45 to 1.05 wt % of the nonionic defoaming agent, wherein the nonionic defoaming agent is a silicon based defoamer; providing a chemical mechanical polishing pad; creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate; wherein the chemical mechanical polishing slurry exhibits a sapphire removal rate of ≥20,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven pad.

The present invention provides a chemical mechanical polishing slurry for polishing an exposed sapphire surface, comprising, as initial components: a colloidal silica abrasive, wherein the colloidal silica abrasive has a negative surface charge; and, wherein the colloidal silica abrasive exhibits a multimodal particle size distribution with a first particle size maximum between 2 and 25 nm; and, a second particle size maximum between 75 and 200 nm; nonionic polydimethylsiloxane based defoamer; optionally, a biocide; and, optionally, a pH adjuster.

DETAILED DESCRIPTION

Applicant has developed a unique chemical mechanical polishing composition and method of polishing a substrate having an exposed sapphire surface using a chemical mechanical polishing slurry that exhibits a sapphire removal rate synergy. Specifically, Applicant has developed a method of chemical mechanical polishing of a substrate having an exposed sapphire surface using a chemical mechanical polishing slurry containing a colloidal silica abrasive; and, optionally, a nonionic defoaming agent; wherein the colloidal silica abrasive exhibits a multimodal particle size distribution; wherein the multimodal particle size distribution comprises a combination of particles forming a first mode with a first particle size maximum between 2 and 25 nm and a second mode with a second particle size maximum between 75 and 200 nm; wherein the combination of the particles forming the first mode with the particles forming the second mode exhibits a first sapphire removal rate synergy; and, wherein the combination of the optional nonionic defoaming agent with the colloidal silica abrasive having a multimodal particle size distribution exhibits a second sapphire removal rate synergy; wherein the chemical mechanical polishing slurry exhibits an enhanced sapphire removal rate (i.e., ≥14,000 Å/hr) under the polishing conditions as described herein in the Examples.

Preferably, the chemical mechanical polishing slurry for polishing an exposed sapphire surface of the present invention, comprises (consists of), as initial components: a colloidal silica abrasive, wherein the colloidal silica abrasive exhibits a negative surface charge when dispersed alone in deionized water; and, wherein the colloidal silica abrasive exhibits a multimodal particle size distribution (preferably a bimodal particle size distribution) with a first particle size maximum between 2 and 25 nm (preferably, 3 to 25 nm; more preferably, 10 to 21 nm; most preferably, 14 to 16 nm); and, a second particle size maximum between 75 to 200 nm (preferably, 75 to 185 nm; more preferably, 75 to 125 nm; still more preferably, 90 to 110 nm; most preferably, 95 to 105 nm); a biocide (preferably, wherein the biocide is hydrogen peroxide); optionally, a nonionic defoaming agent (preferably, 0.1 to 2.0 wt %; more preferably 0.2 to 1.5 wt %; most preferably 0.45 to 1.05 wt %)(preferably, wherein the nonionic defoaming agent is a nonionic silicone based defoamer; more preferably, wherein the nonionic defoaming agent is a nonionic polydimethylsiloxane based defoamer); and, optionally, a pH adjuster.

Preferably, the colloidal silica abrasive used in the chemical mechanical polishing slurry for polishing an exposed sapphire surface of the present invention exhibits a negative surface charge when dispersed alone in deionized water before combining with the other components of the chemical mechanical polishing slurry.

Preferably, the chemical mechanical polishing slurry for polishing an exposed sapphire surface of the present invention contains 5 to 45 wt % (preferably, 10 to 30 wt %; more preferably, 15 to 25 wt %; most preferably 18 to 22 wt %) of the colloidal silica abrasive. Preferably, the colloidal silica abrasive exhibits a multimodal particle size distribution (preferably, a bimodal particle size distribution) with a first particle size maximum between 2 and 25 nm (preferably, 3 to 25 nm; more preferably, 10 to 21 nm; most preferably, 14 to 16 nm); and, a second particle size maximum between 75 to 200 nm (preferably, 75 to 185 nm; more preferably, 75 to 125 nm; still more preferably, 90 to 110 nm; most preferably, 95 to 105 nm). More preferably, the colloidal silica abrasive is a mixture of a first population of colloidal silica particles having an average particle size of 2 to 25 nm (preferably, 3 to 25 nm; more preferably, 10 to 21 nm; most preferably, 14 to 16 nm); and, a second population of colloidal silica particles having an average particle size of 75 to 200 nm (preferably, 75 to 185 nm; more preferably, 75 to 125 nm; still more preferably, 90 to 110 nm; most preferably, 95 to 105 nm). Most preferably, the colloidal silica abrasive is a mixture of a first population of colloidal silica particles having an average particle size of 2 to 25 nm (preferably, 3 to 25 nm; more preferably, 10 to 21 nm; most preferably, 14 to 16 nm); and, a second population of colloidal silica particles having an average particle size of 75 to 200 nm (preferably, 75 to 185 nm; more preferably, 75 to 125 nm; still more preferably, 90 to 110 nm; most preferably, 95 to 105 nm); wherein the chemical mechanical polishing slurry contains 1 to 25 wt % (preferably, 1 to 15 wt %; more preferably, 1 to 10 wt %; most preferably, 3 to 5 wt %) of the first population of colloidal silica particles.

Preferably, the chemical mechanical polishing slurry for polishing an exposed sapphire surface of the present invention comprises 0.0001 to 1 wt % of a biocide. More preferably, the chemical mechanical polishing slurry comprises 0.001 to 0.01 wt % (most preferably, 0.004 to 0.006 wt %) of a biocide. Preferably, wherein the biocide is hydrogen peroxide.

The chemical mechanical polishing slurry for polishing an exposed sapphire surface of the present invention comprises 0 to 5 wt % of a nonionic defoaming agent. Preferably, the chemical mechanical polishing slurry comprises 0.1 to 2.0 wt % (more preferably 0.2 to 1.5 wt %; most preferably 0.45 to 1.05 wt %) of a nonionic defoaming agent. Preferably, wherein the nonionic defoaming agent is a nonionic silicon based defoamer. More preferably, wherein the nonionic defoaming agent is a nonionic polydimethylsiloxane based defoamer (e.g., HS-06 silicone based defoamer from Senka Corporation).

Preferably, the water contained in the chemical mechanical polishing slurry for polishing an exposed sapphire surface of the present invention is at least one of deionized and distilled to limit incidental impurities.

The chemical mechanical polishing slurry for polishing an exposed sapphire surface of the present invention provides efficacy over a pH of >8 to 12. Preferably, the chemical mechanical polishing slurry provides efficacy over a pH of 8.5 to 10.5. Acids suitable for use adjusting the pH of the chemical mechanical polishing slurry include, for example, nitric acid, sulfuric acid and hydrochloric acid. Bases suitable for use adjusting the pH of the chemical mechanical polishing slurry include, for example, ammonium hydroxide and potassium hydroxide.

Preferable, the chemical mechanical polishing slurry for polishing an exposed sapphire surface of the present invention exhibits a sapphire removal rate under the polishing conditions as described herein in the Examples of ≥14,000 Å/hr (preferably, ≥15,000 Å/hr, more preferably, ≥20,000 Å/hr; most preferably, ≥21,000 Å/hr).

Substrates suitable for use in the method of the present invention have an exposed sapphire surface. Preferably, the substrate having an exposed sapphire surface is a sapphire wafer. Preferably, the sapphire wafer is selected from C-plane sapphire wafers, A-plane sapphire wafers, M-plane sapphire wafers and R-plane sapphire wafers. More preferably, the substrate having an exposed sapphire surface is a C-plane sapphire wafer.

Preferably, the chemical mechanical polishing slurry used in the method of the present invention, comprises (consists of), as initial components: a colloidal silica abrasive, wherein the colloidal silica abrasive exhibits a negative surface charge when dispersed alone in deionized water; and, wherein the colloidal silica abrasive exhibits a multimodal particle size distribution (preferably a bimodal particle size distribution) with a first particle size maximum between 2 and 25 nm (preferably, 3 to 25 nm; more preferably, 10 to 21 nm; most preferably, 14 to 16 nm); and, a second particle size maximum between 75 to 200 nm (preferably, 75 to 185 nm; more preferably, 75 to 125 nm; still more preferably, 90 to 110 nm; most preferably, 95 to 105 nm); a biocide (preferably, wherein the biocide is hydrogen peroxide); optionally, a nonionic defoaming agent (preferably, 0.1 to 2.0 wt %; more preferably 0.2 to 1.5 wt %; most preferably 0.45 to 1.05 wt %)(preferably, wherein the nonionic defoaming agent is a nonionic silicone based defoamer; more preferably, wherein the nonionic defoaming agent is a nonionic polydimethylsiloxane based defoamer); and, optionally, a pH adjuster; providing a chemical mechanical polishing pad (preferably, a polyurethane impregnated non-woven polishing pad); creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate; wherein at least some sapphire is removed from the exposed sapphire surface of the substrate.

Preferably, the colloidal silica abrasive used in the method of the present invention exhibits a negative surface charge when dispersed alone in deionized water before combining with the other components of the chemical mechanical polishing slurry.

Preferably, the chemical mechanical polishing slurry used in the method of the present invention contains 5 to 45 wt % (preferably, 10 to 30 wt %; more preferably, 15 to 25 wt %; most preferably 18 to 22 wt %) of the colloidal silica abrasive. Preferably, the colloidal silica abrasive used in the method of the present invention exhibits a multimodal particle size distribution (preferably, a bimodal particle size distribution) with a first particle size maximum between 2 and 25 nm (preferably, 3 to 25 nm; more preferably, 10 to 21 nm; most preferably, 14 to 16 nm); and, a second particle size maximum between 75 to 200 nm (preferably, 75 to 185 nm; more preferably, 75 to 125 nm; still more preferably, 90 to 110 nm; most preferably, 95 to 105 nm). More preferably, the colloidal silica abrasive used in the method of the present invention is a mixture of a first population of colloidal silica particles having an average particle size of 2 to 25 nm (preferably, 3 to 25 nm; more preferably, 10 to 21 nm; most preferably, 14 to 16 nm); and, a second population of colloidal silica particles having an average particle size of 75 to 200 nm (preferably, 75 to 185 nm; more preferably, 75 to 125 nm; still more preferably, 90 to 110 nm; most preferably, 95 to 105 nm). Most preferably, the colloidal silica abrasive used in the method of the present invention is a mixture of a first population of colloidal silica particles having an average particle size of 2 to 25 nm (preferably, 3 to 25 nm; more preferably, 10 to 21 nm; most preferably, 14 to 16 nm); and, a second population of colloidal silica particles having an average particle size of 75 to 200 nm (preferably, 75 to 185 nm; more preferably, 75 to 125 nm; still more preferably, 90 to 110 nm; most preferably, 95 to 105 nm); wherein the chemical mechanical polishing slurry contains 1 to 25 wt % (preferably, 1 to 15 wt %; more preferably, 1 to 10 wt %; most preferably, 3 to 5 wt %) of the first population of colloidal silica particles.

Preferably, the chemical mechanical polishing slurry used in the method of the present invention comprises 0.0001 to 1 wt % of a biocide. More preferably, the chemical mechanical polishing slurry used in the method of the present invention comprises 0.001 to 0.01 wt % (most preferably, 0.004 to 0.006 wt %) of a biocide. Preferably, wherein the biocide is hydrogen peroxide.

The chemical mechanical polishing slurry used in the method of the present invention comprises 0 to 5 wt % of a nonionic defoaming agent. Preferably, the chemical mechanical polishing slurry used in the method of the present invention comprises 0.1 to 2.0 wt % (more preferably 0.2 to 1.5 wt %; most preferably 0.45 to 1.05 wt %) of a nonionic defoaming agent. Preferably, wherein the nonionic defoaming agent is a nonionic silicon based defoamer. More preferably, wherein the nonionic defoaming agent is a nonionic polydimethylsiloxane based defoamer (e.g., HS-06 silicone based defoamer from Senka Corporation).

Preferably, the water contained in the chemical mechanical polishing slurry used in the chemical mechanical polishing method of the present invention is at least one of deionized and distilled to limit incidental impurities.

The chemical mechanical polishing slurry used in the method of the present invention provides efficacy over a pH of >8 to 12. Preferably, the chemical mechanical polishing slurry used provides efficacy over a pH of 8.5 to 10.5. Acids suitable for use adjusting the pH of the chemical mechanical polishing slurry include, for example, nitric acid, sulfuric acid and hydrochloric acid. Bases suitable for use adjusting the pH of the chemical mechanical polishing slurry include, for example, ammonium hydroxide and potassium hydroxide.

Preferable, the chemical mechanical slurry used in the method of the present invention exhibits a sapphire removal rate under the polishing conditions as described herein in the Examples of ≥14,000 Å/hr (preferably, ≥15,000 Å/hr, more preferably, ≥20,000 Å/hr; most preferably, ≥21,000 Å/hr).

Some embodiments of the present invention will now be described in detail in the following Examples.

EXAMPLES

Chemical Mechanical Polishing Slurry Formulations

The chemical mechanical polishing slurry formulations (CMPS's) tested are described in TABLE 1. The chemical mechanical polishing slurries C1-C26 are comparative formulations, which are not within the scope of the claimed invention.

TABLE 1

| CMPS | Avg. size $1^{st}$ pop. (nm) | Conc. $1^{st}$ pop. (wt %) | Avg. size $2^{nd}$ pop. (nm) | Conc. $1^{st}$ pop. (wt %) | $H_2O_2$ (wt %) | Conc. Defoaming Agent (wt %)$^\chi$ | pH* |
|---|---|---|---|---|---|---|---|
| C1  | 4 (α)   | 15   | —       | —    | 0.005 | —   | 10.9 |
| C2  | 4 (α)   | 15   | —       | —    | 0.005 | 1   | 10.9 |
| C3  | 20 (α)  | 19.1 | —       | —    | 0.005 | 0   | 9.63 |
| C4  | 20 (α)  | 19.1 | —       | —    | 0.005 | 0.5 | 9.62 |
| C5  | 20 (α)  | 19.1 | —       | —    | 0.005 | 1   | 9.62 |
| C6  | 55 (α)  | 19.1 | —       | —    | 0.005 | 0   | 9.46 |
| C7  | 55 (α)  | 19.1 | —       | —    | 0.005 | 0.5 | 9.46 |
| C8  | 55 (α)  | 19.1 | —       | —    | 0.005 | 1   | 9.45 |
| C9  | 100 (α) | 19.1 | —       | —    | 0.005 | 0   | 10.0 |
| C10 | 100 (α) | 19.1 | —       | —    | 0.005 | 0.5 | 10.0 |
| C11 | 100 (α) | 19.1 | —       | —    | 0.005 | 1   | 9.97 |
| C12 | 125 (α) | 19.1 | —       | —    | 0.005 | 0   | 10.2 |
| C13 | 125 (α) | 19.1 | —       | —    | 0.005 | 1   | 10.2 |
| C14 | 4 (α)   | 1.5  | 100 (α) | 18.5 | 0.005 | 0   | 10.4 |
| C15 | 4 (α)   | 1.5  | 100 (α) | 18.5 | 0.005 | 0.5 | 10.4 |
| C16 | 45 (α)  | 4    | 100 (α) | 16   | 0.005 | 0   | 9.73 |
| C17 | 45 (α)  | 4    | 100 (α) | 16   | 0.005 | 0.5 | 9.73 |
| C18 | 45 (α)  | 4    | 100 (α) | 16   | 0.005 | 1   | 9.73 |
| C19 | 80 (α)  | 4    | 100 (α) | 16   | 0.005 | 0   | 9.79 |
| C20 | 80 (α)  | 4    | 100 (α) | 16   | 0.005 | 0.5 | 9.79 |
| C21 | 80 (α)  | 4    | 100 (α) | 16   | 0.005 | 1   | 9.77 |
| C22 | 15 (£)  | 8    | 20 (α)  | 32   | —     | 0   | 9.32 |
| C23 | 15 (£)  | 8    | 20 (α)  | 32   | —     | 1   | 9.31 |
| C24 | 15 (£)  | 8    | 45 (α)  | 32   | —     | 0   | 9.59 |
| C25 | 15 (£)  | 8    | 45 (α)  | 32   | —     | 1   | 9.58 |
| C26 | 15 (£)  | 8    | 180 (α) | 32   | —     | 0   | 10.1 |
| 1   | 4 (α)   | 1.5  | 100 (α) | 18.5 | 0.005 | 1   | 10.4 |
| 2   | 15 (£)  | 4    | 100 (α) | 16   | 0.005 | 0   | 10.0 |
| 3   | 15 (£)  | 4    | 100 (α) | 16   | 0.005 | 0.5 | 9.98 |
| 4   | 15 (£)  | 4    | 100 (α) | 16   | 0.005 | 1   | 9.98 |
| 5   | 20 (α)  | 4    | 100 (α) | 16   | 0.005 | 0   | 9.79 |
| 6   | 20 (α)  | 4    | 100 (α) | 16   | 0.005 | 0.5 | 9.79 |
| 7   | 20 (α)  | 4    | 100 (α) | 16   | 0.005 | 1   | 9.78 |
| 8   | 15 (£)  | 8    | 80 (α)  | 32   | —     | 0   | 9.30 |
| 9   | 15 (£)  | 8    | 80 (α)  | 32   | —     | 1   | 9.29 |
| 10  | 15 (£)  | 8    | 100 (α) | 32   | —     | 0   | 9.83 |

TABLE 1-continued

| CMPS | Avg. size 1$^{st}$ pop. (nm) | Conc. 1$^{st}$ pop. (wt %) | Avg. size 2$^{nd}$ pop. (nm) | Conc. 1$^{st}$ pop. (wt %) | H$_2$O$_2$ (wt %) | Conc. Defoaming Agent (wt %)$^\chi$ | pH$^\tau$ |
|---|---|---|---|---|---|---|---|
| 11 | 15 $^{(£)}$ | 8 | 100 $^{ω}$ | 32 | — | 1 | 9.82 |
| 12 | 15 $^{(£)}$ | 8 | 180 $^{∞}$ | 32 | — | 1 | 10.1 |

$^{(a)}$ Nalco 1115 colloidal silica having an average particle size of 4 nm available from Nalco Company.
$^{\chi}$ HS-06 silicone based (polydimethylsiloxane emulsion) nonionic defoamer available from Senka Corporation.
$^{\tau}$ The pH of the slurry was adjusted up to the reported value through the addition of NaOH.
$^{(\%)}$ Nalco 1050 colloidal silica having an average particle size of 20 nm available from Nalco Company.
$^{(u)}$ Nalco 15582 colloidal silica having an average particle size of 55 nm available from Nalco Company.
$^{w}$ Nalco 2329+ colloidal silica having an average particle size of 100 nm available from Nalco Company.
$^{(e)}$ Nalco TX15508 colloidal silica having an average particle size of 125 nm available from Nalco Company.
$^{£}$ Nalco 1142 colloidal silica having an average particle size of 15 nm available from Nalco Company.
$^{(as)}$ Nalco DUSZ-004 colloidal silica having an average particle size of 45 nm available from Nalco Company.
$^{\infty}$ Nalco TX15502 colloidal silica having an average particle size of 180 nm available from Nalco Company.
$^{eo}$ Nalco 2329K colloidal silica having an average particle size of 80 nm available from Nalco Company.

Polishing Tests

The chemical mechanical polishing slurries (CMCS's) described in TABLE 1 were tested using a Buehler EcoMet® 300/AutoMet® 300 grinder-polisher/power head with a 5 inch single head and a 12 inch platen size and a Suba™ 600 polishing pad (commercially available from Rohm and Haas Electronic Materials CMP Inc.) having an X-Y groove pattern with a 2.5 mm width, 15.75 mm pitch and 0.8 mm depth; under a 34.3 kPa down force, a chemical mechanical polishing slurry flow rate of 400 ml/min, a platen speed of 120 rpm and a carrier speed of 120 rpm. Sapphire wafers (4" C-plane) from Monocrystal were initially single-sided, diamond lapped to an average surface roughness of 5 nm and were then polished under the noted conditions. The polishing pad was hand conditioned using a nylon brush. The sapphire removal rate results using the CMCS's identified in TABLE 1 (C1-C26 and 1-12) are provided in TABLE 2 (PC1-PC26 and P1-P12, respectively). The sapphire removal rate data reported in TABLE 2 was determined by comparing the weight of the wafers before and after polishing and converting to a surface removal rate. The polished wafers were sonicated in deionized water for 30 seconds and blown dry with nitrogen before weighing.

TABLE 2

| Ex. | CMPS | Sapphire removal rate (Å/hr) |
|---|---|---|
| PC1 | C1 | 8,000 |
| PC2 | C2 | 8,300 |
| PC3 | C3 | 9,200 |
| PC4 | C4 | 10,500 |
| PC5 | C5 | 11,800 |
| PC6 | C6 | 10,400 |
| PC7 | C7 | 10,800 |
| PC8 | C8 | 11,500 |
| PC9 | C9 | 10,400 |
| PC10 | C10 | 9,900 |
| PC11 | C11 | 9,900 |
| PC12 | C12 | 7,400 |
| PC13 | C13 | 8,400 |
| PC14 | C14 | 11,700 |
| PC15 | C15 | 13,000 |
| PC16 | C16 | 10,600 |
| PC17 | C17 | 11,200 |
| PC18 | C18 | 11,100 |
| PC19 | C19 | 13,000 |
| PC20 | C20 | 11,000 |
| PC21 | C21 | 11,600 |
| PC22 | C22 | 9,600 |
| PC23 | C23 | 9,600 |
| PC24 | C24 | 8,900 |
| PC25 | C25 | 13,100 |
| PC26 | C26 | 13,100 |
| P1 | 1 | 14,200 |
| P2 | 2 | 18,500 |
| P3 | 3 | 21,000 |
| P4 | 4 | 21,000 |
| P5 | 5 | 14,800 |
| P6 | 6 | 15,000 |
| P7 | 7 | 21,700 |
| P8 | 8 | 16,200 |
| P9 | 9 | 20,100 |
| P10 | 10 | 19,100 |
| P11 | 11 | 21,000 |
| P12 | 12 | 15,900 |

We claim:

1. A method of polishing a sapphire substrate, comprising:
providing a substrate having an exposed sapphire surface;
providing a chemical mechanical polishing slurry, wherein the chemical mechanical polishing slurry has a pH of 9 to 10 and wherein the chemical mechanical polishing slurry consists of:
deionized water; 10 to 30 wt % of a colloidal silica abrasive; wherein the colloidal silica abrasive has a negative surface charge; wherein the colloidal silica abrasive is a mixture of a first population of colloidal silica particles having an average particle size of 14 to 16 nm and a second population of colloidal silica particles having an average particle size of 95 to 105 nm; wherein the colloidal silica abrasive contains 1 to 25 wt % of the first population of colloidal silica particles;
0.0001 to 1 wt % of a biocide, wherein the biocide is hydrogen peroxide;
0.45 to 1.05 wt % of a nonionic defoaming agent, wherein the nonionic defoaming agent is a silicon based defoamer; and,
optionally, a pH adjuster;
providing a chemical mechanical polishing pad;
creating dynamic contact at an interface between the chemical mechanical polishing pad and the substrate; and dispensing the chemical mechanical polishing slurry onto the chemical mechanical polishing pad at or near the interface between the chemical mechanical polishing pad and the substrate;

wherein at least some sapphire is removed from the exposed sapphire surface of the substrate and wherein the chemical mechanical polishing slurry exhibits a sapphire removal rate of ≥20,000 Å/hr with a platen speed of 120 revolutions per minute, a carrier speed of 120 revolutions per minute, a chemical mechanical polishing slurry flow rate of 400 ml/min, a nominal down force of 34.3 kPa on a 300 mm polishing machine; and, wherein the chemical mechanical polishing pad is a polyurethane impregnated non-woven polishing pad.

2. The method of polishing a sapphire substrate according to claim 1, wherein the silicon based defoamer is a polydimethylsiloxane based defoamer.

* * * * *